US009912286B2

(12) United States Patent
Rossi

(10) Patent No.: US 9,912,286 B2
(45) Date of Patent: Mar. 6, 2018

(54) FOLDABLE PARASOL

(71) Applicant: Emanuele Rossi, Ramat Gan (IL)

(72) Inventor: Emanuele Rossi, Ramat Gan (IL)

(*) Notice: Subject to any disclaimer, the term of this patent is extended or adjusted under 35 U.S.C. 154(b) by 233 days.

(21) Appl. No.: 14/979,638

(22) Filed: Dec. 28, 2015

(65) Prior Publication Data

US 2016/0192747 A1 Jul. 7, 2016

(30) Foreign Application Priority Data

Jan. 4, 2015 (IL) .......................................... 236578

(51) Int. Cl.
*H02S 30/20* (2014.01)
*A45B 25/00* (2006.01)
*A45B 23/00* (2006.01)
*H01L 31/042* (2014.01)
*H02S 20/30* (2014.01)

(52) U.S. Cl.
CPC .............. *H02S 30/20* (2014.12); *A45B 25/00* (2013.01); *A45B 2023/0012* (2013.01); *A45B 2025/003* (2013.01); *A45B 2200/1027* (2013.01); *A45B 2200/1036* (2013.01); *A45B 2200/1063* (2013.01); *H01L 31/042* (2013.01); *H02S 20/30* (2014.12); *Y02E 10/50* (2013.01)

(58) Field of Classification Search
CPC .............................................. A45B 2200/1027
See application file for complete search history.

(56) References Cited

U.S. PATENT DOCUMENTS

| | | | | |
|---|---|---|---|---|
| 3,046,701 | A * | 7/1962 | Small ..................... | A45B 25/18 135/29 |
| 3,397,399 | A * | 8/1968 | Carman ................... | F24J 2/125 135/33.2 |
| 3,692,035 | A * | 9/1972 | Houston ................ | A45B 23/00 135/16 |
| 4,713,492 | A * | 12/1987 | Hanak ..................... | H02S 30/20 126/624 |
| 8,104,491 | B2 * | 1/2012 | Li .......................... | A45B 23/00 135/16 |
| 8,695,614 | B2 * | 4/2014 | Chaimovski ........... | A45B 23/00 135/16 |
| 9,006,940 | B2 * | 4/2015 | Korman ................. | H01L 31/042 136/245 |
| 9,088,181 | B2 * | 7/2015 | Akin ....................... | H02J 7/35 |
| 9,125,462 | B2 * | 9/2015 | Akin ...................... | A45B 25/00 |
| 9,185,988 | B1 * | 11/2015 | Sanchez .................. | A47C 7/66 |
| 9,716,464 | B2 * | 7/2017 | Collins ................... | H02S 20/10 |

(Continued)

FOREIGN PATENT DOCUMENTS

WO WO 2014/018990 1/2014

*Primary Examiner* — David R Dunn
*Assistant Examiner* — Danielle Jackson
(74) *Attorney, Agent, or Firm* — Alphapatent Associates, Ltd; Daniel J. Swirsky

(57) ABSTRACT

A foldable parasol having a top surface with a plurality of rigid surfaces, each having at least one solar cell fixed thereto, and at least one mechanical hinge disposed between each adjacent two rigid surfaces, for allowing folding one rigid surface in relation to the other, the at least one mechanical hinge comprising an electrical conductor, for electrically conducting between poles of solar cells of the adjacent rigid surfaces, thereby electrical conduction between solar cells of different rigid surfaces is applied through mechanical hinges, being durable to folding.

8 Claims, 4 Drawing Sheets

(56) References Cited

U.S. PATENT DOCUMENTS

| | | | |
|---|---|---|---|
| 9,781,985 B2 * | 10/2017 | Akin | A45B 25/02 |
| 2005/0161067 A1 * | 7/2005 | Hollins | A45B 23/00 |
| | | | 135/16 |
| 2007/0194997 A1 | 8/2007 | Nakanishi et al. | |
| 2010/0180922 A1 * | 7/2010 | McKenna | A45B 25/18 |
| | | | 135/96 |
| 2010/0326849 A1 * | 12/2010 | Trimarche | A45B 3/04 |
| | | | 206/223 |
| 2014/0009103 A1 * | 1/2014 | Nita | H02J 7/355 |
| | | | 320/101 |
| 2017/0055653 A1 * | 3/2017 | Pan | A45B 25/00 |

* cited by examiner

FOLDABLE PARASOL

CROSS-REFERENCE TO RELATED APPLICATIONS

This application claims the benefit of priority from Israel Patent Application No. 236578, filed Jan. 4, 2015, the disclosure of which is incorporated herein by reference.

TECHNICAL FIELD

The invention relates to the field of parasols. More particularly, the invention relates to parasols including independent power supply therefor.

BACKGROUND

There is a long felt need for a parasol having an independent power supply.

One of the problems regarding such a product is how to make it portable and light. The main problem is how to fold the power supply sources without breaking the electric connections therebetween.

WO2014018990 discloses a foldable parasol having solar cells. However, the solar cells of WO2014018990 occupy a small portion of the area of the parasol, since the solar cells are not foldable.

SUMMARY

In one aspect of the invention a portable parasol having an independent power supply is provided.

Other aspects of the invention will become apparent as the description proceeds.

In one aspect of the invention a foldable parasol is provided, comprising:
- a top surface comprising a plurality of rigid surfaces, each comprising at least one solar cell fixed thereto; and
- at least one mechanical hinge disposed between each adjacent two rigid surfaces, for allowing folding one rigid surface in relation to the other, the at least one mechanical hinge comprising an electrical conductor, for electrically conducting between poles of solar cells of the adjacent rigid surfaces,
- thereby electrical conduction between solar cells of different rigid surfaces is applied through mechanical hinges, being durable to folding.

The reference numbers have been used to point out elements in the embodiments described and illustrated herein, in order to facilitate the understanding of the invention. They are meant to be merely illustrative, and not limiting. Also, the foregoing embodiments of the invention have been described and illustrated in conjunction with systems and methods thereof, which are meant to be merely illustrative, and not limiting.

BRIEF DESCRIPTION OF THE DRAWINGS

Embodiments, features, and aspects of the invention are described herein in conjunction with the following drawings.

The drawings are not necessarily drawn to scale.

DETAILED DESCRIPTION

The invention will be understood from the following detailed description of embodiments thereof, which are meant to be descriptive and not limiting. For the sake of brevity, some well-known features, methods, systems, procedures, components, circuits, and so on, are not described in detail.

Figure 1:
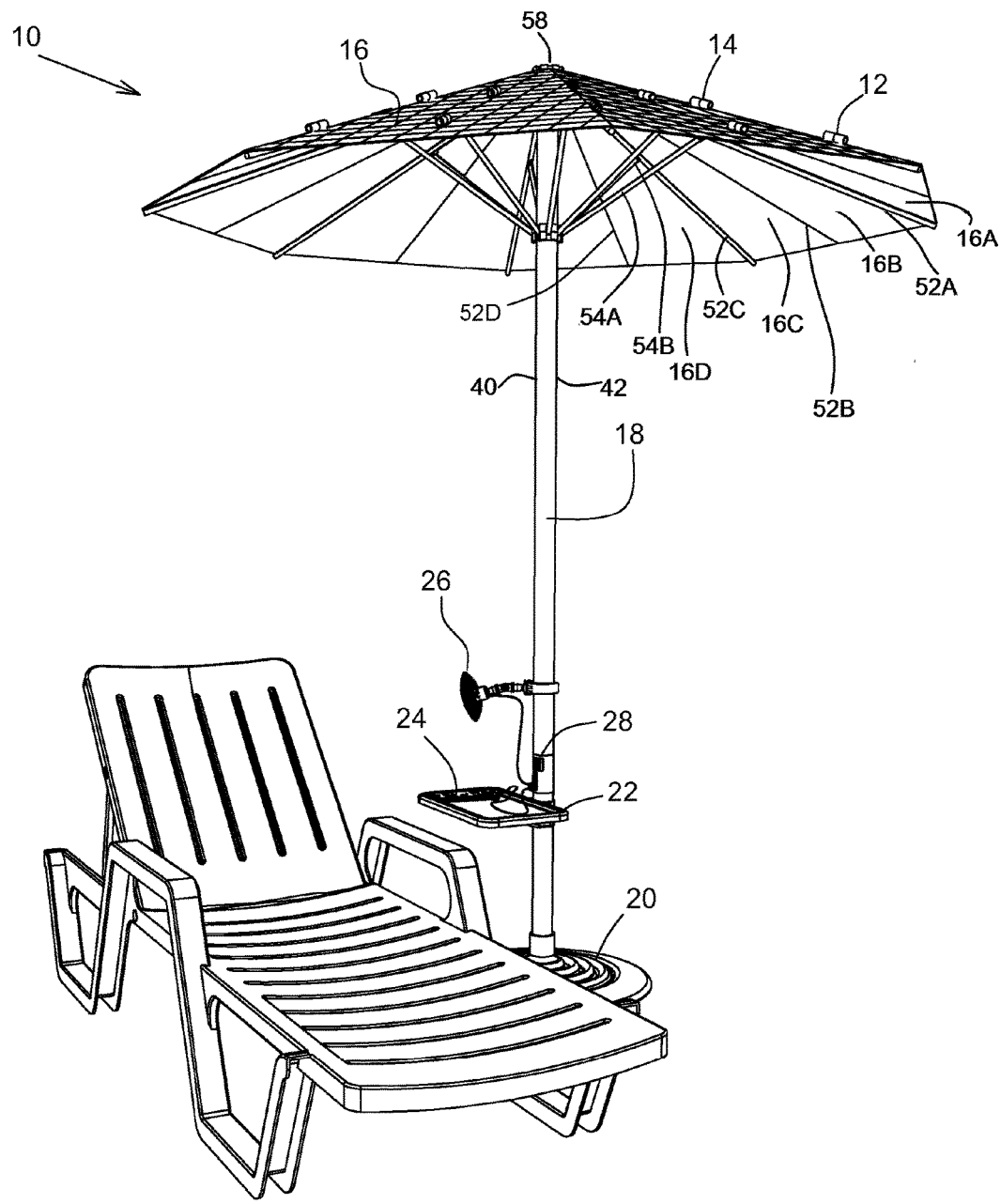
FIG. 1 is a perspective view of a parasol according to one embodiment of the invention at the deployed state.

FIG. 1 is a perspective view of a parasol according to one embodiment of the invention at the deployed state.

A round foldable parasol or umbrella typically includes a frame and a plurality of deploying rods.

Like a typical parasol, the top surface 50 of parasol 10 according to the invention also includes a frame including a plurality of rigid deploying rods 52A, 52C, 52E, etc., each being supported by a supporting rod, namely deploying rod 52A is supported by a supporting rod 54A, deploying rod 52C is supported by a supporting rod 54C, and deploying rod 52E is supported by a supporting rod 54E.

Figure 2:
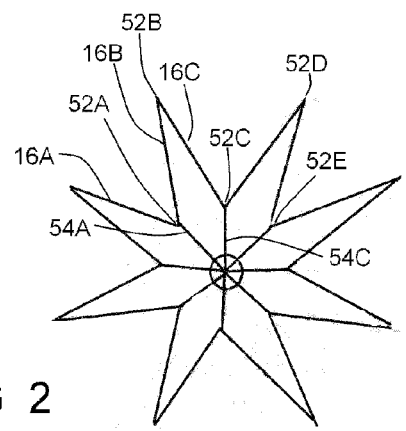
FIG. 2 is a top view of the top surface of the parasol of FIG. 1 at the folded state.

FIG. 2 is a top view of the top surface of the parasol of FIG. 1 at the folded state.

The top surface of a typical round parasol, upon folding thereof is substantially folded along the deploying rigid deploying rods 52A, 52C, 52E, etc.

The top surface, even of a typical parasol constituting a fabric only for the top surface, upon folding thereof is further folded substantially along the center lines between rigid deploying rods 52A, 52C, 52E, etc., namely along line 52B being at the center between deploying rods 52A and 52C; along line 52D being at the center between deploying rods 52C and 52E; etc.

Thus, the top surface, even of a typical parasol constituting a fabric only for the top surface, upon folding thereof is formed to a plurality of right angle triangle flat surfaces, namely to a right angle triangle flat surface 16B between deploying rod 52A and line 52B; a right angle triangle flat surface 16C between line 52C and deploying rod 52A; etc.

In contrast to the typical parasol, in which each right angle triangle flat surfaces 16A, 16B, 16C may further be folded since they are made of fabric, surfaces 16A, 16B, 16C of parasol 10 are substantially rigid.

Figure 3:
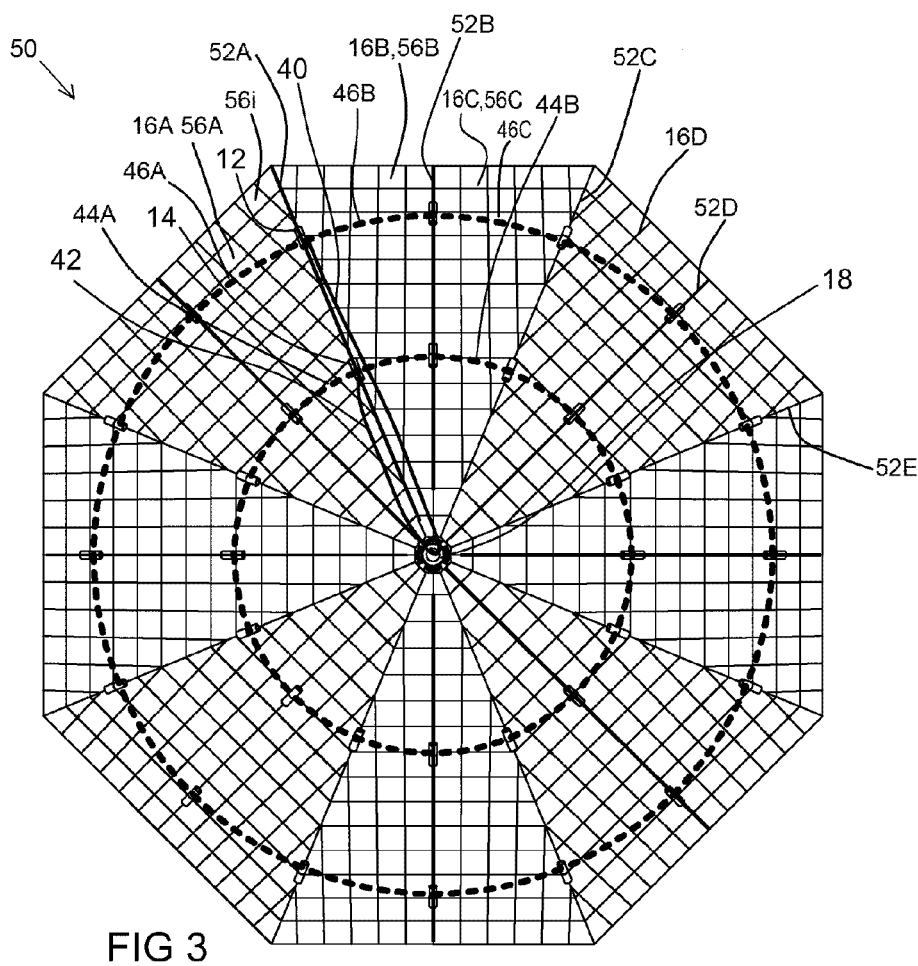
FIG. 3 is a top view of the top surface of the parasol of FIG. 1 at the deployed state.

FIG. 3 is a top view of the top surface of the parasol of FIG. 1 at the deployed state.

According to one embodiment, each of right angle triangle flat surfaces 16A, 16B, 16C, 16D constitutes a single solar cells, namely flat surface 16A constitutes a solar cell 56A, flat surface 16B constitutes a solar cell 56B, and flat surface 16C constitutes a solar cell 56C.

According to another embodiment right angle triangle flat surface 16A may constitute a plurality of solar cells, namely 56A, 56i, being rigidly connected to surface 16A, and being electrically connected one to the other. Since solar cells 56A and 56i are disposed on a substantially rigid surface 16A, the electrical connection between them is never mechanically folded, and thus is durable.

The electrical connection between solar cells of different rigid surfaces, such as between solar cell 56A of rigid surface 16A and solar cell 56B of rigid surface 16B, is available only through electrical conducting mechanical hinges 12.

Figure 4:
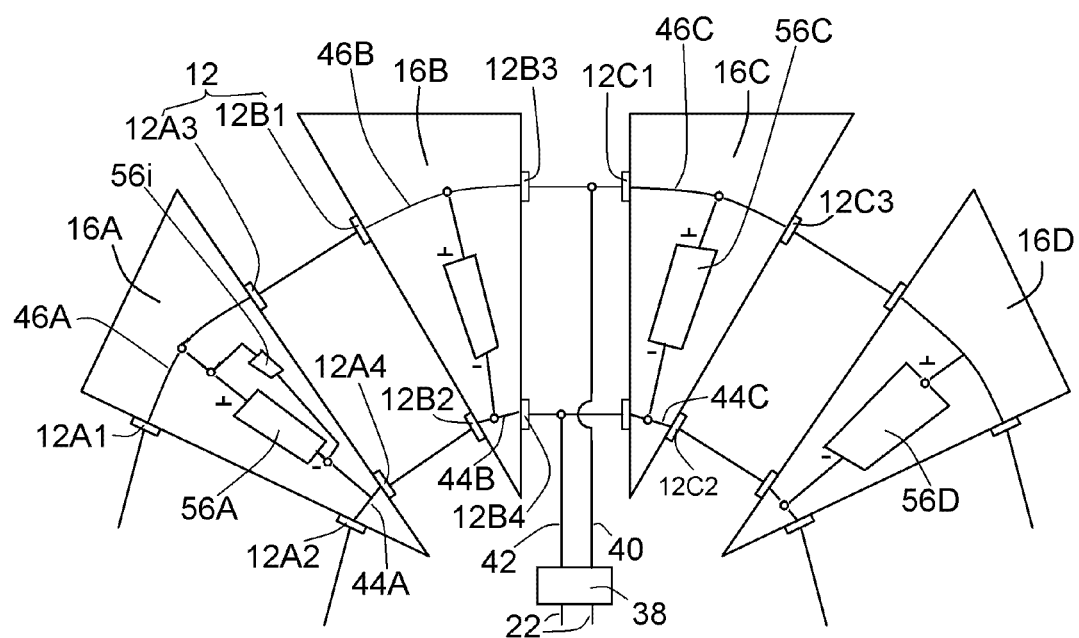
FIG. 4 is a scheme describing the mechanical structure of the parasol of FIG. 1, and the electrical structure for parallel wiring between the solar cells of FIG. 3.

FIG. 4 is a scheme describing the mechanical structure of the parasol of FIG. 1, and the electrical structure for parallel wiring between the solar cells of FIG. 3.

Each electrical conducting mechanical hinge 12 includes two conducting members. For example, electrical conducting mechanical hinge 12 between flat surfaces 16A and 16B, and between the positive poles of solar cells thereof 56A and 56B, includes a conducting member 12A3 connected to the positive pole of solar cell 56A of flat surface 16A; and a conducting member 12B1 connected to the positive pole of solar cell 56B of flat surface 16B.

Even though each power supply source should include only one positive pole and one negative pole, each of flat surfaces 16A includes two positive poles connected one to the other, for supplying the positive outputs thereof to the solar cells of the adjacent flat surfaces; and two negative poles connected one to the other, for supplying the negative outputs thereof to the solar cells of the adjacent flat surfaces.

For example, flat surface 16B includes two positive poles connected one to the other by a wire 46B, for supplying the positive output of conducting member 12B1 to conducting member 12A3 of the adjacent flat surface 16A; and for supplying the positive output of conducting member 12B3 to conducting member 12C1 of the adjacent flat surface 16C.

Flat surface 16B further includes two negative poles connected one to the other by a wire 44B, for supplying the negative output of conducting member 12B2 to conducting member 12A4 of the adjacent flat surface 16A; and for supplying the negative output of conducting member 12B4 to conducting member 12C2 of the adjacent flat surface 16C.

A central wire 40 transfers the positive supply; and central wire 42 transfers the negative supply.

Appropriate wiring may be applied for serial electric connection between the solar cells.

Figure 5:
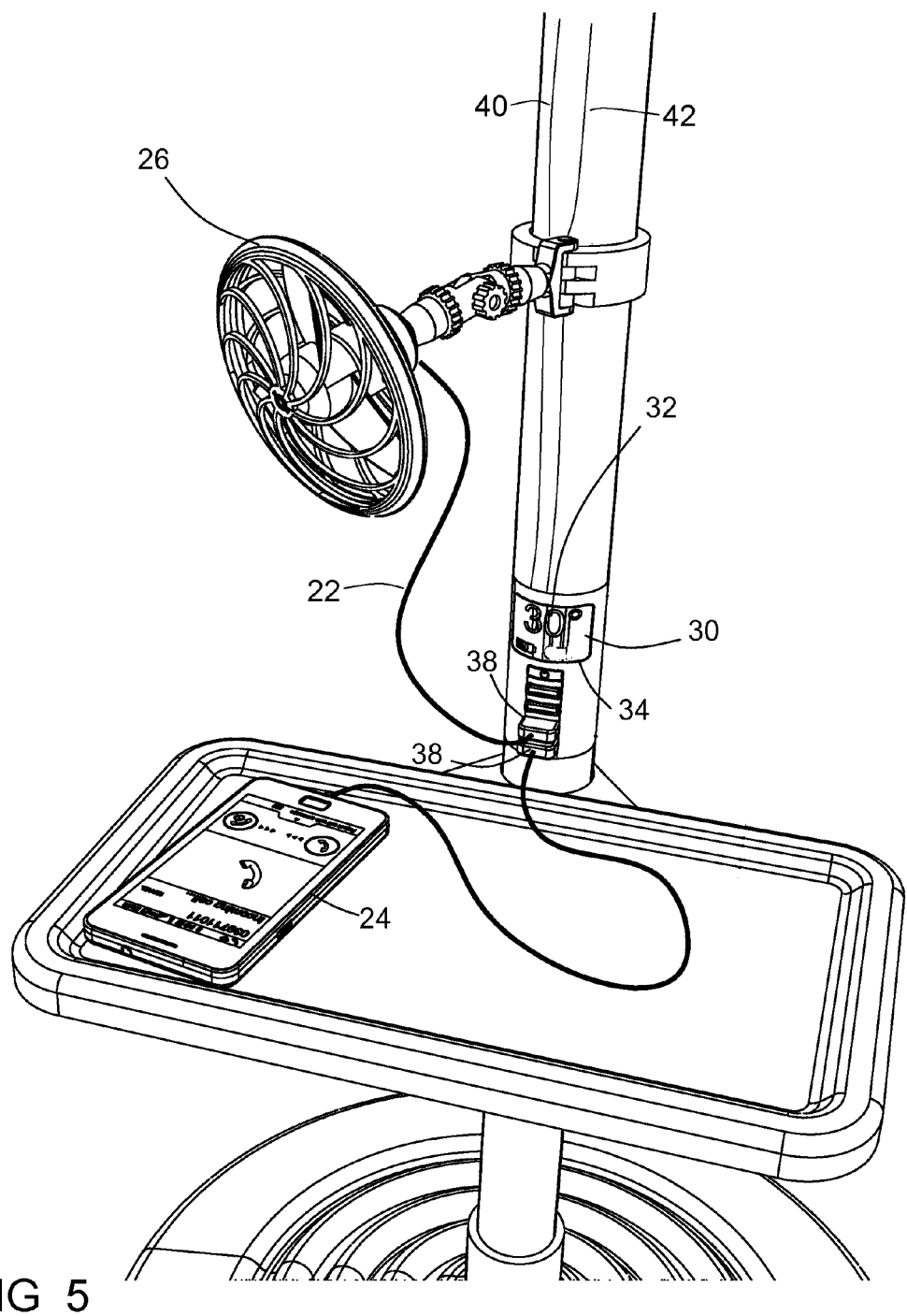
FIG. 5 is a perspective view of the bottom of the parasol of FIG. 1.

FIG. 5 is a perspective view of the bottom of the parasol of FIG. 1.

Wires 40 and 42 which may cross from electrical conducting mechanical hinge 12, are preferably threaded to the center (enumerated in FIG. 1 of parasol 10, and into the hollowed pedestal 18, to a rechargeable battery 34, and to electrical plugs 38, for supplying power to electric appliances 26, 24, and 30.

Thus, the invention is directed to a foldable parasol (10), comprising:
  a top surface (50) comprising a plurality of rigid surfaces (16A, 16B), each comprising at least one solar cell (56A) fixed thereto; and
  at least one mechanical hinge (12) disposed between each adjacent two rigid surfaces (16A, 16B), for allowing folding one rigid surface (16A) in relation to the other (16B), the at least one mechanical hinge (12) comprising an electrical conductor, for electrically conducting between poles (12A3, 12B1) of solar cells (56A, 56B) of the adjacent rigid surfaces (16A, 16B),
thereby electrical conduction between solar cells (56A, 56B) of different rigid surfaces (16A, 16B) is applied through mechanical hinges (12), being durable to folding.

The foldable parasol (10) may further comprise:
  at least one electric wire (44A) for each one of the rigid surfaces (16B), the at least one electric wire (44B) for connecting at least two mechanical hinges (12) of the one of the rigid surfaces (16B),
thereby the at least one electric wire (44A) supplies a single output of the at least one solar cell (56B) of the one of the rigid surfaces (16B) to at least two solar cells (56A, 56C) of at least two adjacent rigid surfaces (16A, 16B).

The top surface (50) is round.

The foldable parasol (10) may further comprise:
  a pedestal (18); and
  a plurality of rotatable supporting rods (54A, 54B), for supporting the plurality of rigid surfaces (16A, 16B), while allowing folding the parasol.

Each line (52B, 52D) between two adjacent rigid surfaces (16B, 16C) is rigid.

The electric conduction between poles (12A3, 12B1) of solar cells (56A, 56B) of the adjacent rigid surfaces (16A, 16B) may comprise parallel wiring between the solar cells.

The electric conduction between poles (12A3, 12B1) of solar cells (56A, 56B) of the adjacent rigid surfaces (16A, 16B) may comprise serial wiring between the solar cells.

The shape of each of the at least one solar cell (56A) is a triangle.

The shape of each of the at least one solar cell (56A) is a right angle triangle.

In the figures and/or description herein, the following reference numerals (Reference Signs List) have been mentioned:
  numeral 10 denotes a parasol according to one embodiment of the invention;
  numerals 12, 12A1, 12A2, 12A3, 12A4, 12B1, 12B2, 12B3, 12B4, 12C1, 12C2 denote electrical conducting mechanical hinges;
  numeral 16A, 16B, 16C and 16D denote rigid surfaces of the top surface of the parasol;
  numeral 18 denotes a pedestal, which preferably is hollowed;
  numeral 22 denotes an electric wire of an appliance;
  numeral 24 denotes a telephone;
  numeral 26 denotes a fan;
  numeral 28 denotes a controller;
  numeral 30 denotes a screen;
  numeral 32 denotes the temperature displayed by the screen;
  numeral 34 denotes a rechargeable battery;
  numeral 38 denotes an electrical plug;
  numeral 40 denotes an electrical wire, for supplying the positive voltage of the solar cells to the electrical plug;
  numeral 42 denotes an electrical wire, for supplying the negative voltage of the solar cells to the electrical plug;
  numerals 44A, 44B, 44C each denote a wire for one solar cell, for supplying the negative output to two adjacent solar cells;
  numerals 46A, 46B, 46C each denote a wire for one solar cell, for supplying the positive output to two adjacent solar cells;
  numeral 50 denotes the top surface of the parasol;
  numerals 52B, 52D denote lines being borders between adjacent rigid surfaces, being hinged therebetween by the electrical conducting mechanical hinges;
  numerals 54A, 54C and 54E denote supporting rods, each for supporting two adjacent surfaces of the top surface of the parasol;
  numerals 56A, 56i, 56B, 56C, 56D denotes solar cells.

The foregoing description and illustrations of the embodiments of the invention has been presented for the purposes of illustration. It is not intended to be exhaustive or to limit the invention to the above description in any form.

Any term that has been defined above and used in the claims, should to be interpreted according to this definition.

The reference numbers in the claims are not a part of the claims, but rather used for facilitating the reading thereof. These reference numbers should not be interpreted as limiting the claims in any form.

What is claimed is:

1. A foldable parasol, comprising:
    a top surface comprising a plurality of rigid surfaces, each comprising at least one solar cell fixed thereto;
    at least one mechanical hinge disposed between each adjacent two rigid surfaces, for allowing folding one rigid surface in relation to the other, said at least one mechanical hinge comprising an electrical conductor, for electrically conducting between poles of solar cells of said adjacent rigid surfaces; and
    at least one electric wire for each one of said rigid surfaces, said at least one electric wire for connecting at least two mechanical hinges of said one of said rigid surfaces,
    thereby electrical conduction between solar cells of different rigid surfaces is applied through mechanical hinges, and
    thereby said at least one electric wire supplies a single output of said at least one solar cell of said one of said rigid surfaces to at least two solar cells of at least two adjacent rigid surfaces.

2. A foldable parasol according to claim 1, wherein said top surface is round.

3. A foldable parasol according to claim 1, further comprising:
    a pedestal (18); and
    a plurality of supporting rods, for supporting said plurality of rigid surfaces.

4. A foldable parasol according to claim 1, wherein said electric conduction between poles of solar cells of said adjacent rigid surfaces comprises parallel wiring between said solar cells.

5. A foldable parasol according to claim 1, wherein said electric conduction between poles of solar cells of said adjacent rigid surfaces comprises serial wiring between said solar cells.

6. A foldable parasol according to claim 1, wherein a shape of each of said at least one solar cell is a triangle.

7. A foldable parasol according to claim 1, wherein a shape of each of said at least one solar cell is a right angle triangle.

8. A foldable parasol according to claim 1, wherein most of said top surface comprises solar cells.

* * * * *